(12) United States Patent
Hoult et al.

(10) Patent No.: US 6,384,603 B2
(45) Date of Patent: May 7, 2002

(54) QUADRATURE RF FIELD COIL FOR USE IN MAGNETIC RESONANCE (75) Inventors: David Hoult; Jarod Matwiy, both of Winnipeg (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/779,687

(22) Filed: Feb. 9, 2001

Related U.S. Application Data (60) Provisional application No. 60/181,545, filed on Feb. 10, 2000.

(51) Int. Cl.[7] ................................................. G01V 3/00
(52) U.S. Cl. ....................................... 324/318; 324/322
(58) Field of Search ................................. 324/318, 319, 324/320, 321, 322, 300, 306, 307, 309

(56) References Cited

U.S. PATENT DOCUMENTS

| | | | | |
|---|---|---|---|---|
| 4,721,913 A | * | 1/1988 | Hyde et al. | 324/318 |
| 4,875,013 A | | 10/1989 | Murakami et al. | 324/318 |
| 5,057,777 A | | 10/1991 | Kurczewski | 324/318 |
| 5,321,360 A | * | 6/1994 | Mansfield | 324/322 |
| 5,445,153 A | | 8/1995 | Sugie et al. | 324/322 |
| 5,483,159 A | | 1/1996 | Van Heelsbergen | 324/318 |
| 5,502,387 A | * | 3/1996 | McGill | 324/318 |

* cited by examiner

Primary Examiner—Louis Arana
(74) Attorney, Agent, or Firm—Adrian D. Battison; Michael R. Williams; Ryan W. Dupuis

(57) ABSTRACT

There is described a quadrature radio frequency (RF) coil design to be used with appropriate magnetic resonance imaging (MRI) hardware to obtain images of the human body. The design provides good RF field homogeneity over a volume suitable for thoracic diagnostic imaging, and operates in quadrature mode as a transmit and/or receive coil. The design is for use with a 0.33 tesla permanent, C shaped magnet with a vertical main field but is of general applicability. The coil includes two parallel annular coils connected at top and bottom by two plate conductors. The plates are split longitudinally and transversely and connected across the splits by capacitors to define two modes of resonant oscillation which can be tuned separately and independently to the same frequency, where the modes define fields which are mutually orthogonal. The fields are at right angles to the magnetic field and to the plate conductors so that the sample can be inserted through the openings at right angles to the plates.

15 Claims, 8 Drawing Sheets

QUADRATURE RF FIELD COIL FOR USE IN MAGNETIC RESONANCE

This application claims convention under 37 CFR 119 from U.S. provisional application Ser. No. 60/181,545, filed Feb. 10, 2000.

This invention relates to quadrature radio frequency coil design for use in magnetic resonance experiments.

BACKGROUND OF THE INVENTION

One type of magnet used in magnetic resonance imaging is that which provides a cylindrical bore in which the main field of the magnet is axial along the length of the bore. Magnets of this type provide a high magnetic field that is more forgiving to inefficiencies in the design and use of other components in the system, without reducing the signal to noise ratio beyond an acceptable limit.

For the purposes of carrying out various experiments it is desirable to provide a volume coil in which the sample, which may in some cases be a part of the body of a patient, can be inserted into a space inside the coil that provides a substantially homogeneous RF field throughout the anatomy of interest.

Images can be obtained from such magnets using several common types of coil to generate radio frequency fields, including the known arrangements of the Alderman-Grant, saddle or Helmholtz coil designs. The radio frequency fields produced by the above coils are however linearly polarized.

By using circularly polarized fields (from so called "quadrature" coils), a theoretical improvement of up to 40% in signal to noise ratio is possible. Many designs of quadrature type coils are available, however all or most are designed for an arrangement using the above cylindrical bore type magnet in which the main field of the magnet is longitudinal with the patient.

The common cylindrical magnet provides a high magnetic field strength and therefore higher image resolution, but has significant disadvantages in that it limits access to the patient and in that it generally requires superconducting elements and therefore cryogenics in order to obtain the higher field strength.

Other magnet designs in use are of a low field, "open" type in which the main magnetic field is perpendicular to the axis of the patient, and Is substantially vertical. These magnets have advantages of improved access and can in many cases avoid the necessity for cryogenics by the use of permanent magnets. However they produce a significantly reduced magnetic field so it is necessary to ensure high efficiency in the use and arrangement of the RF coil to overcome the loss of resolution inherent in low field designs.

Prior art coils are shown in U.S. Pat. No. 5,483,159 (Van Heelsvergen) issued Jan. 9, 1996; U.S. Pat. No. 5,057,777 (Kurczewski) issued October 1991; U.S. Pat. No. 4,875,013 (Murakami) issued Oct. 17, 1989 and U.S. Pat. No. 5,445,153 (Sugie) issued Aug. 29, 1995.

Van Heelsvergen, Kurczewski and Sugie disclose designs of orthogonal or quadrature coils for use in magnetic resonance imaging. However none of these designs is suitable for an arrangement as set forth above in which the magnetic field is at right angles to the direction of insertion of the part of the patient or sample into the hollow interior of the coil.

Van Heelsvergen discloses a coil formed of two spaced, parallel, coaxial, annular coil portions interconnected at diametrically opposed positions by conductors extending at right angles to the planes of the two annular coil portions. However the two modes of resonance are produced by current paths which are entirely different from those of the present invention and the design is unsuitable for the arrangement as set forth in the present invention.

SUMMARY OF THE INVENTION

It is one object of the present invention to provide a quadrature radio frequency coil for use in a magnet in which the magnetic field lies at right angles to a direction of insertion of a sample into the magnetic field. Such a coil is particularly but not exclusively arranged for use with a magnet where the field is vertical and the sample is inserted horizontally.

The present invention, according to a first aspect, provides a quadrature radio frequency field coil for use in a unidirectional magnetic field for effecting magnetic resonance experiments on a sample comprising:

a first annular conductor lying generally in a first plane at a first end of the coil;

a second annular conductor lying generally in a second plane at a second end of the coil;

the first and second planes being parallel and spaced so as to define a hollow interior of the coil into which the sample can be received;

the first annular conductor including at least one first capacitor connected therein in series;

the second annular conductor including at least one second capacitor connected therein in series;

the first and second annular conductors and the first and second capacitors being arranged such that, in a first mode, current can be caused to flow therein to generate a first oscillating radio frequency field, which is substantially homogeneous within the hollow interior, at a resonant frequency dependent upon the shape and inductance of the first and second annular conductors, the capacitance, and the mutual inductance therebetween;

a first plate conductor having a length extending across the annular conductors generally at right angles to the first and second planes so as to bridge the space therebetween;

a second plate conductor having a length extending across the annular conductors generally at right angles to the first and second planes so as to bridge the space therebetween;

the first and second plate conductors being arranged at diametrically opposed locations on the annular conductors and being generally parallel so as to be located on opposite sides of the hollow interior;

the plate conductors being arranged such that, in a second mode, current can be caused to flow in a circuit along the first plate conductor, through the first annular conductor to the second plate conductor, along the second plate conductor and through the second annular conductor to the first plate conductor;

the circuit including at least one third capacitor;

the circuit and the third capacitor being arranged to generate a second oscillating radio frequency field, at a resonant frequency dependent upon the shape and impedance of the first and second plate conductors;

the plate conductors having a width transverse to the length thereof which is sufficient to cause the second field to be substantially homogeneous within the hollow interior;

the first and second annular conductors and the first and second plate conductors being shaped and arranged and the first, second and third capacitors being arranged such that the first and second fields have the same resonant frequency and such that the first and second fields are substantially mutually orthogonal and arranged for co-operation with a magnetic field at right angles to the plane of the plate conductors.

Preferably, in order to effect tuning of the coil to the required frequency, the first and second capacitors are arranged relative to the conductors such that the capacitance thereof does not affect the resonant frequency of the second mode, and the third capacitor is arranged such that the capacitance thereof does not affect the resonant frequency of the first mode created by the first and second annular conductors.

Preferably the first capacitor is connected in series with the first annular conductor at a longitudinal split in one of the first and second plate conductors, wherein the second capacitor is connected in series with the second annular conductor at a longitudinal split in one of the first and second plate conductors and wherein at least one of the first and second plate conductors is split transversely with the at least one third capacitor connected therein in series. Thus in a simple arrangement, one of the plate conductors is split longitudinally and the same or the other plate conductor is split transversely. It is also possible for both to be split both longitudinally and transversely with capacitors provided between each of the splits. Other configurations between these two extremes can also be adopted depending upon requirements.

Preferably the first plate conductor is split longitudinally, the first capacitor is connected in series with the first annular conductor at the longitudinal split in the first plate conductor, the second capacitor is connected in series with the second annular conductor at the longitudinal split in the first plate conductor and one of the first and second plate conductors is split transversely with the at least one third capacitor connected therein in series. It will be appreciated that additional capacitors can be provided in series at additional splits in the plate conductors.

Preferably the first plate conductor is split both longitudinally and transversely so as to form four separate portions interconnected by said capacitors. In this arrangement, it is possible to add a tuning capacitor connected diagonally across the transverse and longitudinal splits which is adjustable to tune the fields so as to be more accurately orthogonal.

The apparatus includes a console for creating oscillating signals to supply to the coil for generating said first and second fields and a coupling or driving circuit for communicating said signals to the coil. The coil can be driven through the coupling circuit by mutual inductance with one or more driving coils. More preferably, the driving circuit includes a first cable communicating a part of the signal through capacitors, across a split in one of the annular conductors and a second cable communicating a part of the signal through capacitors, across a split in one of the plate conductors.

Preferably the driving circuit includes an adjustable impedance for matching the impedance of the coil to the impedance of the transmission lines and amplifiers.

Preferably for research uses rather than clinical testing, at least one of the capacitors in the annular rings and at least one of the capacitors on the plate conductors are adjustable for accurately tuning the resonant frequencies.

According to a second aspect the invention provides an apparatus for effecting magnetic resonance experiments on a sample comprising:

a magnet having a magnetic field extending in a unidirectional field direction through a space for receiving the sample;

a quadrature radio frequency field coil as defined above:

an MRI console for creating oscillating signals for supply to the coil for generating said first and second fields;

and a driving circuit for communicating said signals to the coil.

According to a third aspect the invention provides a method for effecting magnetic resonance experiments on a sample comprising:

providing a sample;

providing a magnet having a magnetic field extending in a unidirectional field direction through a space for receiving the sample;

providing a quadrature radio frequency field coil having:

a first annular conductor lying generally in a first plane at a first end of the coil;

a second annular conductor lying generally in a second plane at a second end of the coil;

the first and second planes being parallel and spaced so as to define a hollow interior of the coil into which the sample can be received;

the first annular conductor being shaped and arranged to surround an opening into the hollow interior;

the first annular conductor including at least one first capacitor connected therein in series;

the second annular conductor including at least one second capacitor connected therein in series;

a first plate conductor having a length extending across the annular conductors generally at right angles to the first and second planes so as to bridge the space therebetween;

a second plate conductor having a length extending across the annular conductors generally at right angles to the first and second planes so as to bridge the space therebetween;

the first and second plate conductors being arranged at diametrically opposed locations on the annular conductors and being generally parallel so as to be located on opposite sides of the hollow interior;

mounting the coil within the space arranged such that the magnetic field lies at right angles to the plane of the plate conductors;

inserting the sample into the hollow interior through one of the openings;

arranging the first and second annular conductors and the first and second capacitors and applying power thereto as an oscillating signal such that, in a first mode, current flows therein to generate a first oscillating radio frequency field, which is substantially homogeneous within the hollow interior, at a resonant frequency dependent upon the shape and impedance of the first and second annular conductors, the capacitors in series with them, and the mutual inductance therebetween;

arranging the first and second plate conductors and a third capacitor in series therein and applying power thereto as an oscillating signal such that, in a second mode, current flows in a circuit along the first plate conductor, through the first annular conductor to the second plate conductor, along the second plate conductor and through the second annular conductor to the first plate conductor to generate a second oscillating radio frequency field, at a resonant frequency dependent upon the shape and impedance of the first and second plate conductors and the impedance of the third capacitor;

arranging the plate conductors with a width transverse to the length thereof which is sufficient to cause the second field to be substantially homogeneous within the hollow interior;

and arranging the first and second annular conductors and the first and second plate conductors and arranging the first, second and third capacitors such that the first and second fields have the same resonant frequency and such that the first and second fields are substantially mutually orthogonal.

BRIEF DESCRIPTION OF THE DRAWINGS

Embodiments of the invention will now be described in conjunction with the accompanying drawings in which.

DETAILED DESCRIPTION

The arrangement as shown in the figures provide a quadrature radio frequency coil suitable for use in situations where the main magnetic field is perpendicular to the axis of the patient. The design provides good radio frequency field homogeneity over a volume suitable for human body imaging.

Most quadrature coils use two identical but orthogonal elements or arrays of elements. As they are designed for situations where the main field is parallel to the axis of a patient (i.e. head to toe) a simple rotation about that axis by 90 is quite feasible. When the main field is perpendicular to the axis such rotation is infeasible—the patient gets in the way. Most common quadrature designs are limited thusly, examples are Birdcage, TEM, and quadrature Alderman-Grant coils. The present design generates the two orthogonal radio frequency field components needed to create a circularly polarised field from a single structure that doesn't interfere with the introduction of the sample. These two components are created by utilising a commonly disregarded higher order resonance present in many coil designs. This yields a design that is effective, yet simple to fabricate and set up.

Figure 1:
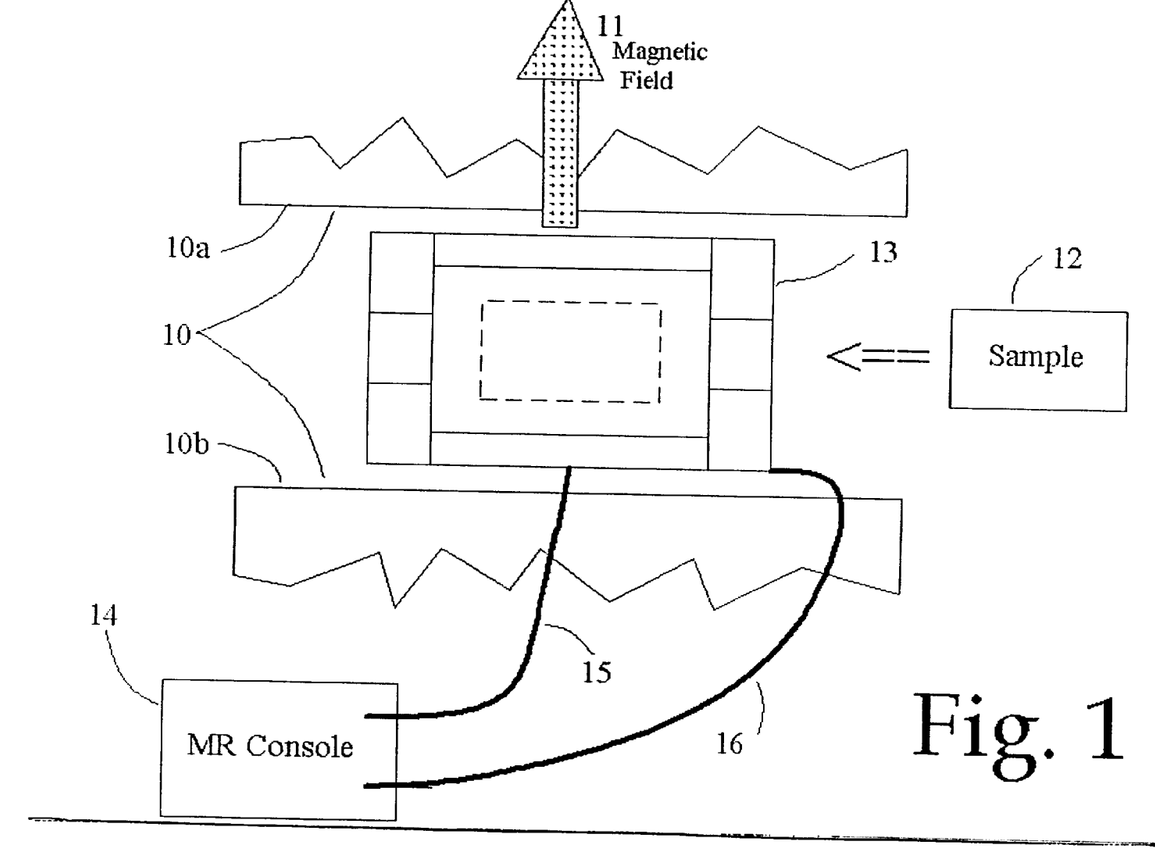
FIG. 1 is a schematic side elevational view of an apparatus for magnetic resonance experiments including a magnet of the type having a vertical magnetic field and a quadrature coil according to the present invention.

In FIG. 1 is shown schematically an apparatus for magnetic resonance imaging or other magnetic resonance experiments in which the magnet indicated at 10 provides a main magnetic field 11 which is at right angles to the direction of insertion of a sample 12. Thus in practice the sample may be a prone or supine patient that is inserted into the space between the poles 10A and 10B of the magnet in a horizontal direction with the magnetic field 11 at right angles or vertical. The apparatus includes the coil 13 of the present invention as described in more detail hereinafter. The coil is powered and controlled by a console schematically indicated at 14 with the signals being communicated to the coil via two cables 15 and 16 which connect to the coil as described hereinafter. The console is shown only schematically as its details are well known to one skilled in the art.

Figure 2:
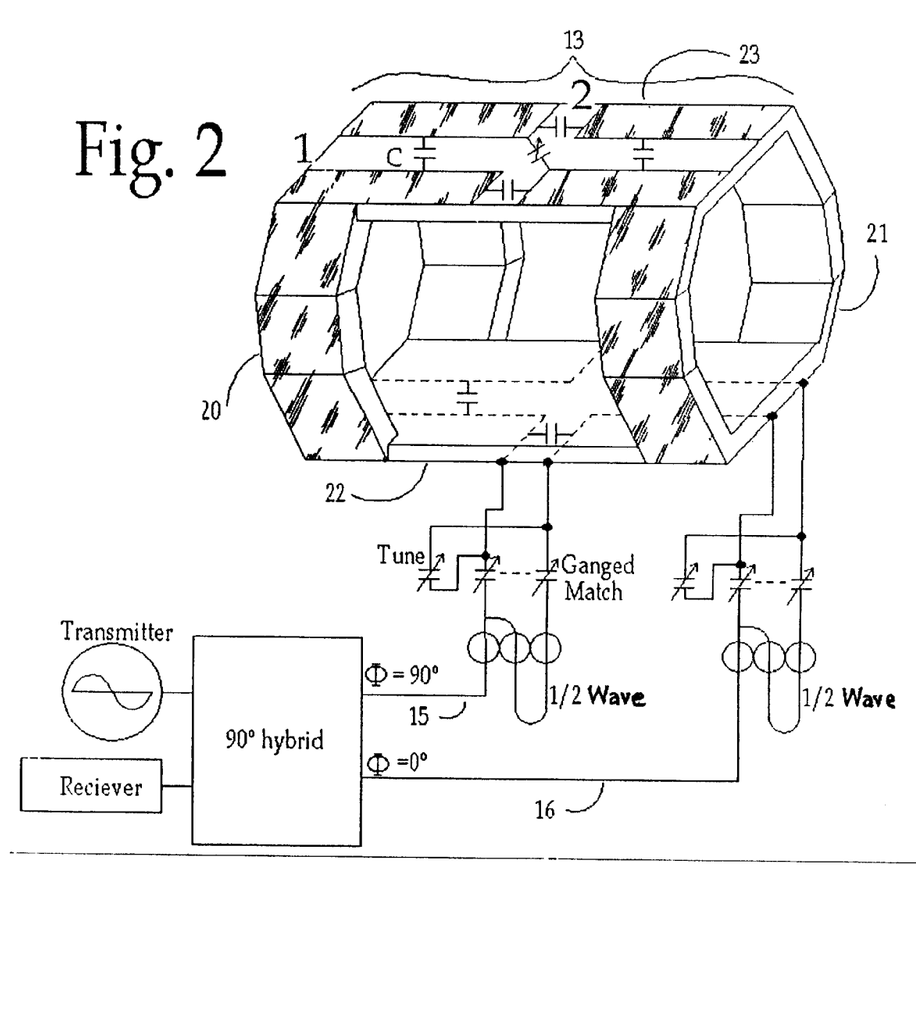
FIG. 2 is a schematic isometric view of the coil of FIG. 1 and power coupling thereto.

In FIG. 2 is shown an isometric view of the coil 13 of FIG. 1 together with the connection of the cables 15 and 16 to the coil. The coil comprises two annular coil sections 20 and 21 each arranged to lie substantially in a common plane at a respective end of the interior volume with the two planes parallel and spaced by the length of the interior volume.

At diametrically opposed positions on the annular conductors 20 and 21 is provided two plate conductors 22 and 23. The plate conductors are horizontal and parallel and spaced so as to define the top and bottom surfaces of the volume of the coil.

The plate conductors have a length so that they span the space between the annular conductors. The plates have a width transversely of the length thereof which is sufficient so that the field generated by the plates is substantially homogeneous within the volume defined by the coil.

The annular rings are generally circular and the top and bottom plates encompass 80 degrees of the top and bottom of the rings, leaving a 100 degree space on either side. The annular rings are separated by a distance equal to one radius of the rings. The annular coils and the sides between them are open to allow the sample to be inserted through either opening, or in the case of a patient to lie projecting into the coil thorough one of the openings.

In the embodiment shown in FIG. 2, each of the two plates 22 and 23 is split by a narrow space both longitudinally along a center line and transversely across a center line. These slits or spaces are then bridged by capacitors C as shown. The current paths in the two resonant frequency modes are shown and described in detail hereinafter.

Figure 8:
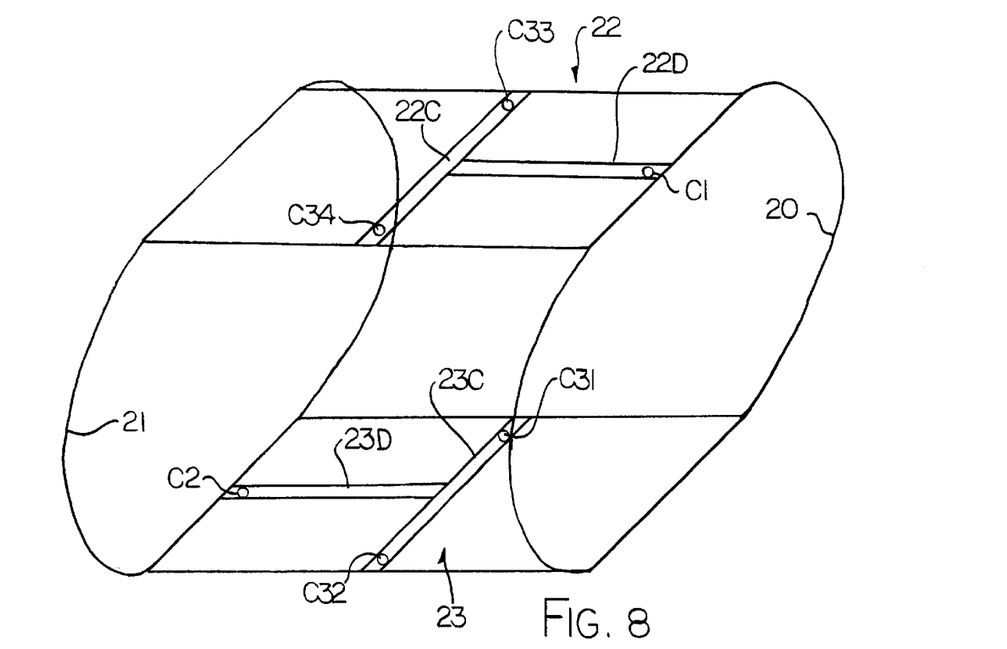
FIGS. 8 and 9 show two alternative arrangements of the coil wherein the number of splits in the plate conductors and capacitors bridging those splits in the conductors is decreased for simplicity of construction and minimization of parts.
Figure 9:
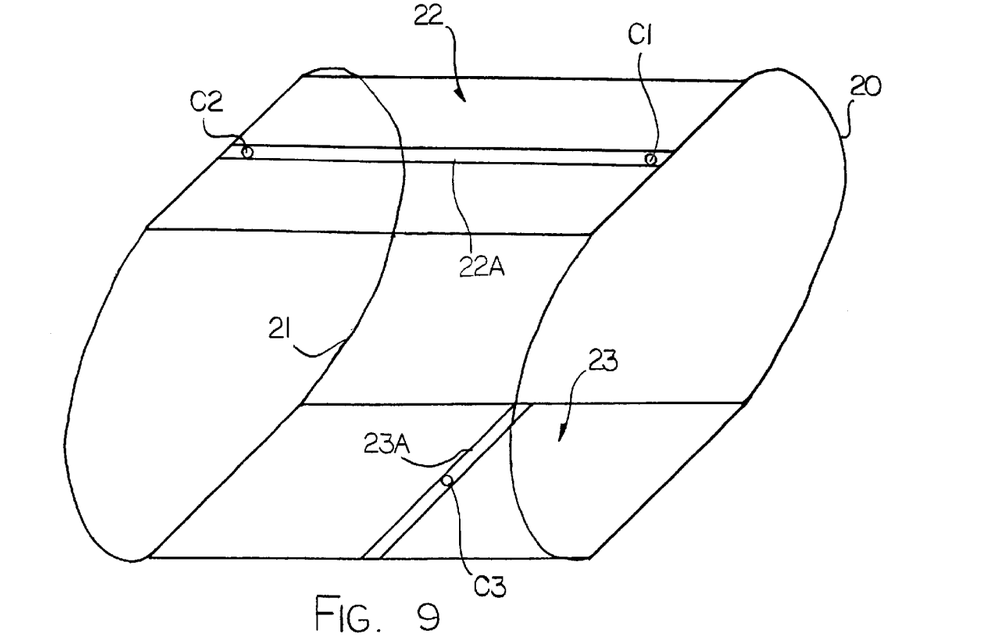

In FIGS. 8 and 9 are shown simplified arrangements of the same construction in which the number of splits in the plate conductors is significantly reduced. Thus a most simplified construction is shown in FIG. 9 where one of the plate conductors is split transversely as indicated at 23A and the other of the plate conductors is slit longitudinally as indicated at 22A. Thus the annular conductor 20 contains a first capacitor C1 at the slit 22A. Symmetrically the annular conductor 21 contains a second capacitor C2 at the slit 22A. A circuit in which current flows across the top plate conductor 22 down through the two sides of the annular conductor 20 and back across the bottom plate conductor 23 to the two legs of the annular conductor 21 contains in series a third capacitor C3. These two modes as described in more detail hereinafter provide the two current paths for the orthogonal fields described.

A further simplified arrangement is provided in FIG. 8 in which the top plate 22 is split transversely as indicated at 22C and one part of it is also split longitudinally as indicated at 22D. The bottom plate 23 is arranged symmetrically so that it includes a transverse split 23C and a part longitudinal split 23D. This construction also provides the same two current paths as set forth above and as described in more detail hereinafter, but includes four capacitors C31, C32, C33 and C34 in replacement for the single capacitor C3 of the embodiment shown in FIG. 9.

Simple analysis of the more complex arrangement shown in FIG. 2 in comparison with the simplified arrangements of FIGS. 8 and 9 will show a number of alternatives in which the same two current paths are defined as described hereinafter.

More particularly, these arrangements provide a construction in which the first and second capacitors are arranged relative to the circuit containing the plate conductors so that they do not affect the resonant frequency of the circuit containing the plate conductors. Symmetrically the capacitor C3 does not affect the frequency of the two annular conductors 20 and 21. The two modes are therefore independent of one another and can be tuned independently by selecting the values of the capacitor C1, C2 and C3 separately.

As described in more detail hereinafter, the cables 15 and 16 together with the adjustable capacitors therein which allow tuning and matching the two resonators are simply connected across the splits in the individual conductors. Thus cable 15 which provides power to the second mode is connected at the transverse split in the bottom plate conductor. The cable 16 is connected at the longitudinal split in the bottom plate conductor. Thus the cable 15 provides a signal across the circuit driving the second mode and symmetrically the cable 16 connects a signal across one of the annular conductors driving the first mode.

Figure 3:
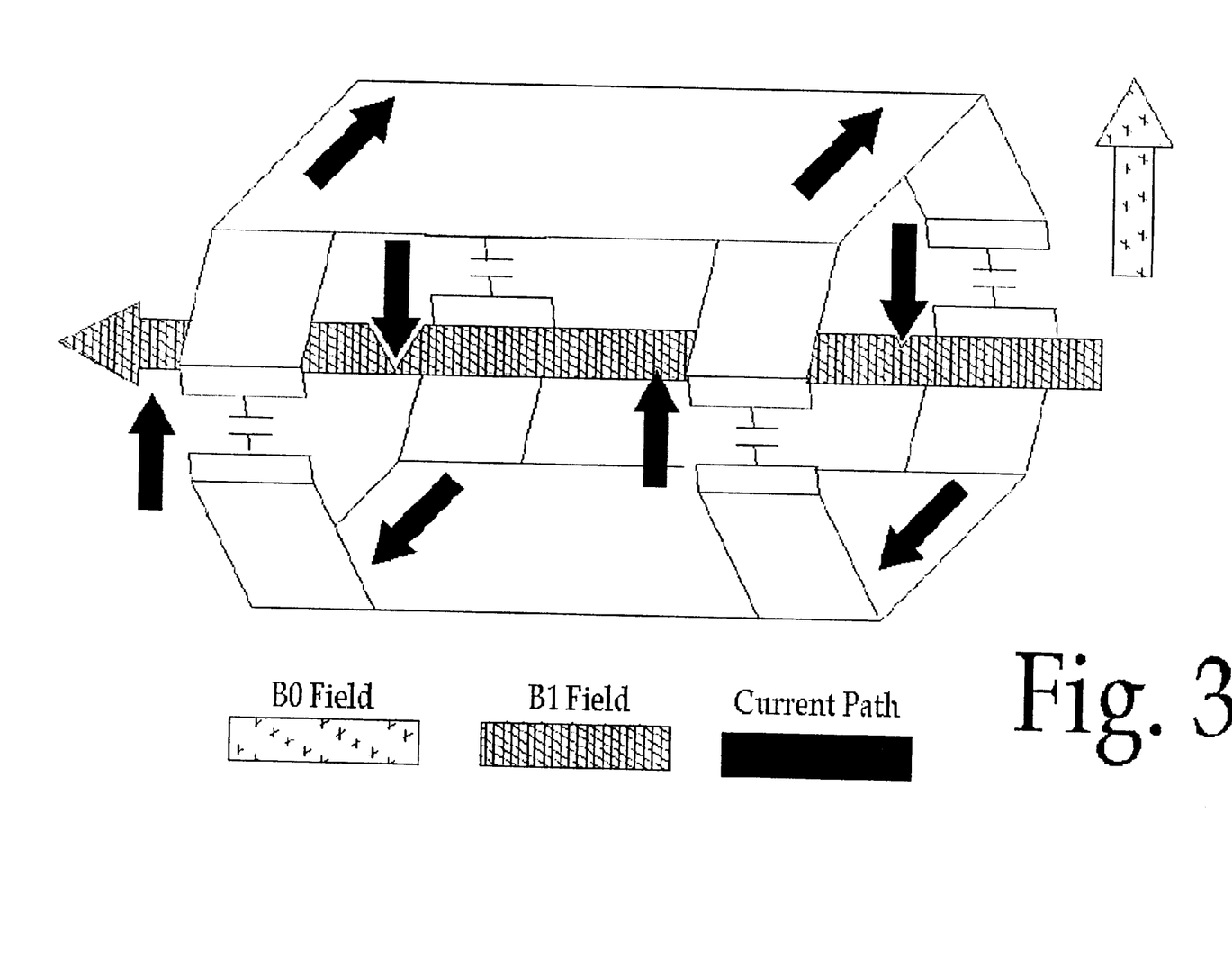
FIG. 3 is a view similar to that of FIG. 2 showing the current path in a first resonant mode.
Figure 5:
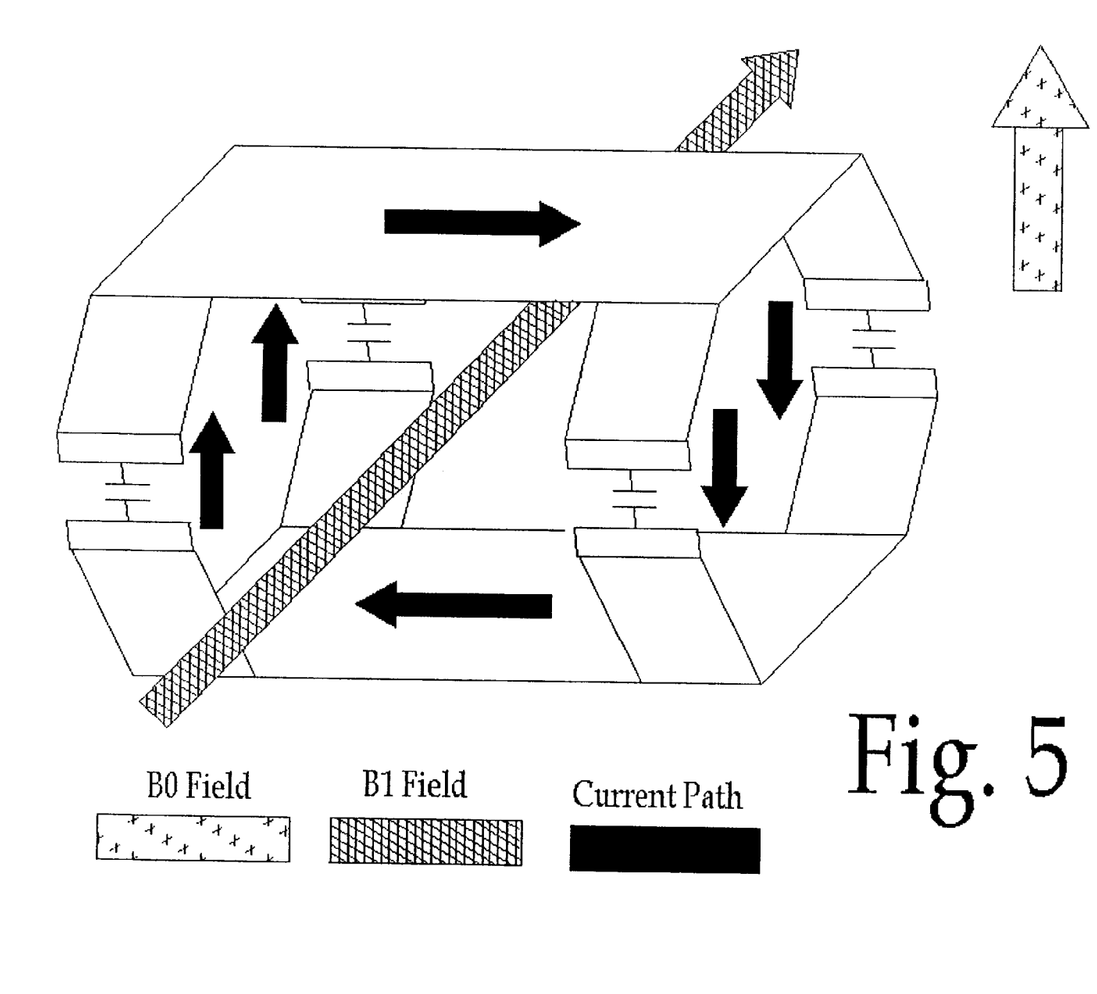
FIG. 5 is a view similar to that of FIG. 2 showing the current path in a second resonant mode.

The first mode is shown in FIG. 3 and the second mode is shown in FIG. 5.

The quadrature radio frequency (RF) coil design is arranged to be used with appropriate magnetic resonance imaging (MRI) hardware to obtain images of the human body. The design will provide good RF field homogeneity over a volume suitable for thoracic diagnostic imaging, and will operate in quadrature mode as a transmit and/or receive coil. The design as shown is for use with a 0.33 tesla permanent, C shaped magnet with a vertical main field but is of general applicability.

In building and tuning RF coils for magnetic resonance imaging, there is often more than one resonant peak present in the spectrum of the fields created by the coils. Generally, one peak is associated with a useful, homogeneous magnetic field and is set to occur at the magnetic resonance frequency of interest, while other peaks are often associated with higher order fields that are generally ignored.

Figure 6:
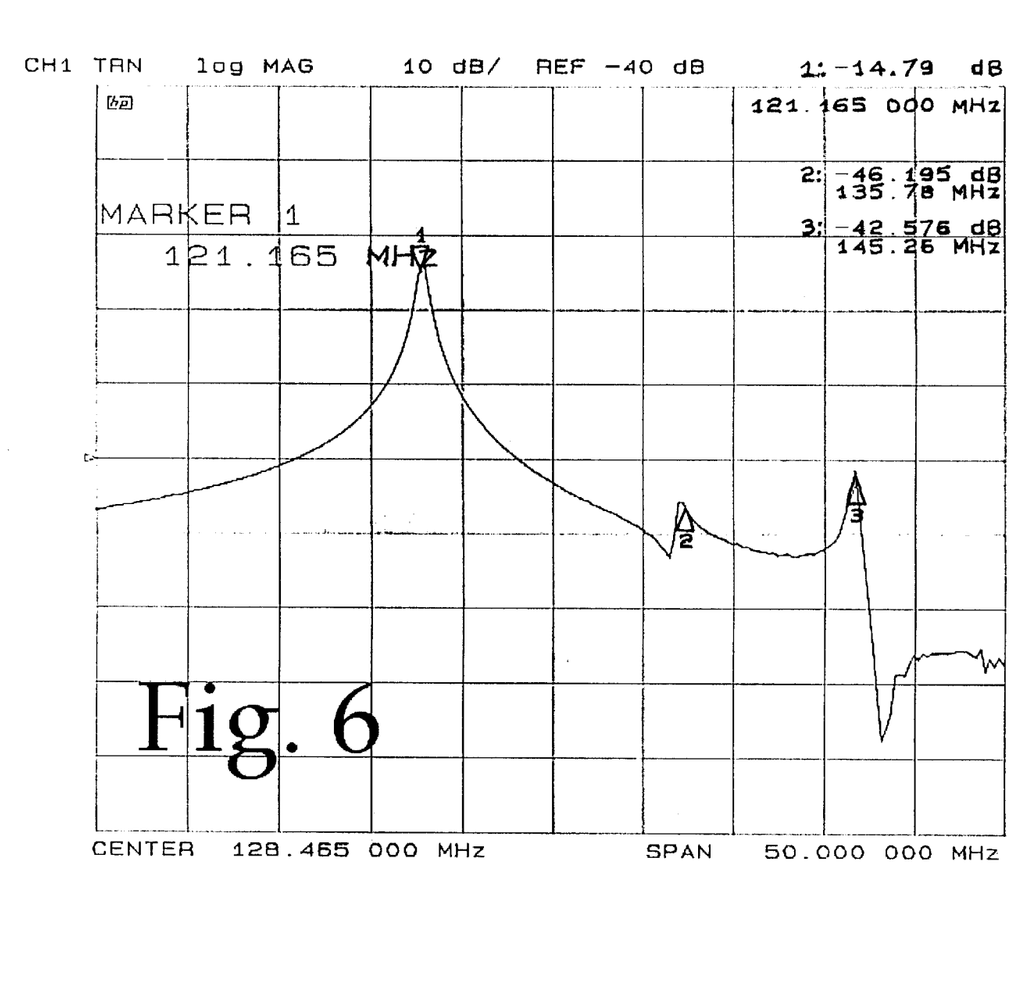
FIG. 6 is a graph showing the frequency response of the mode of FIG. 5.

By way of example the usual operation of a typical linear coil of the "Alderman Grant" type that provides the second mode used herein. A transverse RF magnetic field is formed by current flowing in one direction through the top panel and the opposite direction through the bottom. The resonant response shown in FIG. 6 may be measured with the aid of a network analyser by driving a search coil situated beside the resonator and then displaying the voltage induced in a second search coil inside the resonant structure. The field homogeneity can be monitored by moving the second search coil through the volume of interest inside the structure and watching how the spectrum changes in amplitude. In FIG. 6, only the large peak marked as "1" is usually associated with a field having good homogeneity and would be the resonance of choice when this coil is used in a linear mode. By contrast, the signal marked as "3" is a gradient field produced by opposing currents flowing around the two end rings and is not utilized in the present design.

The resonance marked as "2" on the display would normally also be ignored. Its frequency is usually much different than the desired mode, and being small in comparison, is usually considered as nothing more than a nuisance. However, consider the situation shown in FIG. 4 where the search coils are rotated 90° from their first position. The resonance at frequency "2" is now much stronger and resonance "1" much weaker. FIG. 3 shows the distribution of current that is used in the first mode herein responsible for this resonant mode and it is approximately that associated with Helmholtz's name. The two end rings of current in annular conductors 20 and 21 create a radio frequency field, with good homogeneity, that runs down the axis of the coil—perpendicular to the field created by the mode of FIG. 5.

In other words, both modes "1" and "2" create approximately homogeneous orthogonal fields—the correct conditions for creation of a circularly polarised field—but unfortunately, at different frequencies. The orientations of the driving and sensing search coils determine how big a response is seen from them by the network analyser and it is easy to overlook resonance "2" in FIG. 6 and resonance "1" in FIG. 4 because the search coils and fields are nominally perpendicular.

By forcing modes 1 and 2 to be at the same frequency, we have a quadrature coil that is compatible with an MRI system in which the main field is perpendicular to the axis of the patient.

In FIG. 5, are shown the current and magnetic flux paths associated with resonance 1 in FIG. 6. This mode of current flow generates a magnetic field in the transverse direction. The field is fairly homogenous within the confines of the coil. The frequency response of this configuration is shown in FIG. 6, with a large peak at marker position 1 and smaller peaks at positions 2 and 3. Resonance 3 is associated with opposing currents on opposite sides of the coil, but resonance 2 is of interest as it is associated with fields along the axis of the coil, as shown in FIG. 2. These fields are perpendicular to the driving and search coils, and are only detected because of field inhomogeneity and/or minor errors in the orientations of the coils. These plots show the frequencies of the two modes before correction for quadrature operation. Of course, the two frequencies would have to be equal to each other and to the NMR frequency dictated by the field strength of the magnet.

Figure 4:
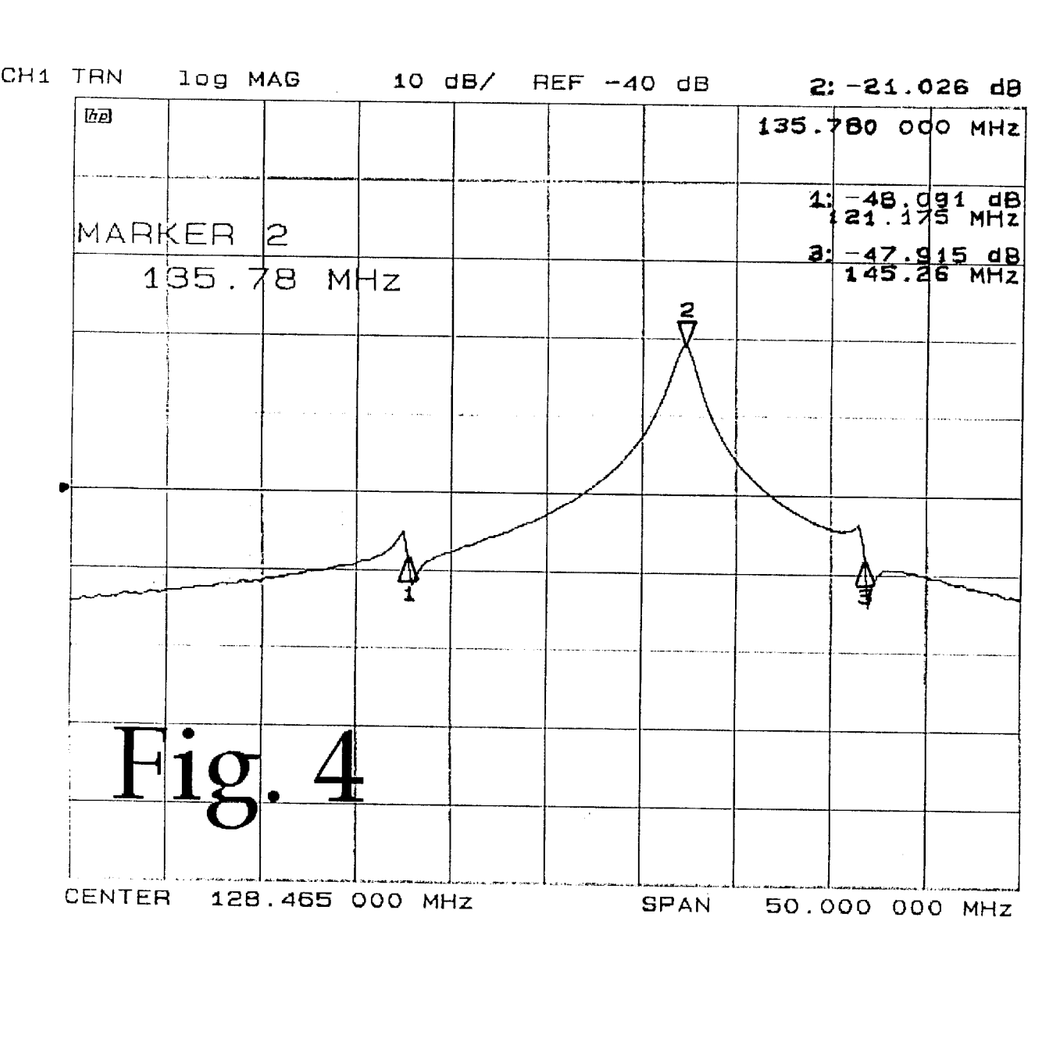
FIG. 4 is a graph showing the frequency response of the mode of FIG. 3.

In FIG. 3, are shown the current and magnetic flux paths associated with resonance 2 in FIG. 4. This mode of current flow generates a magnetic field in the axial direction. The field is again fairly homogenous within the confines of the coil but at a different frequency to mode 1. The frequency response of this configuration is shown in FIG. 4, with the large peak now at marker position 2 and smaller peaks at positions 1 and 3. Again, this plot shows the response before correction for quadrature.

To transform the two linear modes 1 and 2 into a quadrature probe, the following is necessary:

Change the geometry of the coil for a better fit to the sample such as the human torso and a vertical field magnet;

Not change the geometry so much that the homogeneity of either mode was overly compromised;

Find a way to drive and tune each channel independently of the other;

Measure and find ways to improve the isolation of the two modes.

Optimized Alderman Grant and Helmholtz coils are cylindrical along one axis. This is acceptable for some applications, but for ours where the human body is quite elliptical, the poor filling factor due to empty space above and below the body in imaging position would degrade the signal quality. In addition, a cylindrical coil would likely not fit in a vertical field magnet since there is usually only slightly more space between the poles than a human body would fill.

Figure 7:
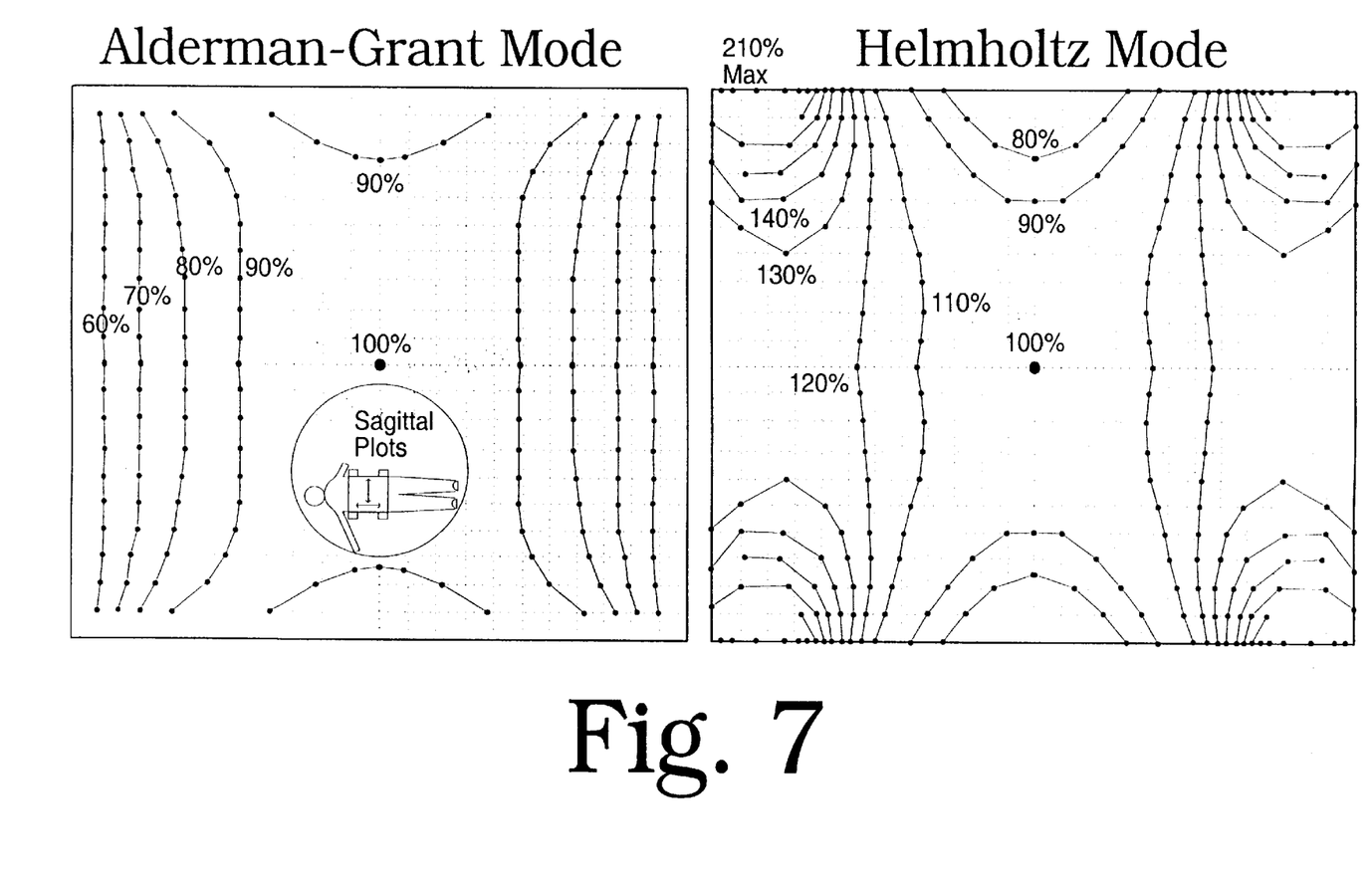
FIG. 7 is two graphs showing a field amplitude map in the x-z plane for each of the two quadrature channels of the above modes showing the RF voltage levels induced in a search coil compared to the maximum signal (100%) at the center of the volume. The grid comprises 2 cm squares.

Compressing the coil into a roughly elliptical shape does not spoil the homogeneity of either channel by an excessive amount. Field plots of our sample are shown in FIG. 7.

It is necessary to drive, match, and tune each mode independently so that each presents an impedance of 50 ohms resistive to the transmitter and receiver at the magnetic resonance frequency. Thus the top and bottom panels are divided into quadrants and the tuning capacitors attached across the resulting cuts. There are no capacitors across the legs. This allows fully independent control of each mode's frequency, and provides points at which to drive one mode with negligible interaction with the other. The resulting schematic in FIG. 2 show the top of the coil, with fixed capacitors and the single variable isolation adjustment capacitor. The bottom is cut in the same way, but only fixed capacitors are present.

The two orthogonal modes of the device are driven by a quadrature hybrid, known to one skilled in the art, which creates the necessary phase relationships for efficient transmission and signal reception. To ensure electrical balance, connection is made through half wavelength baluns and the matching capacitors are split and ganged.

The probe is fed from a quadrature hybrid, which generates the necessary phase relationships for efficient transmission and signal reception, through two half-wave baluns and ganged matching capacitors. On the schematic in FIG. 2, the two wide cuts in the top panel, with bridging capacitors, are marked as "1" and "2" to indicate which mode the capacitors bridging the gaps control. The purpose of the baluns is to maintain electrical balance, but it can be argued that the attachment points of one mode unbalance the second mode and vice versa. However, at the low frequency at which this probe functions, this is not a problem provided the coaxial feeds to the two baluns have their (ground) braids connected at minimal distances from the probe.

Cross-talk between the two modes was found initially to be rather large at −10 dB, indicating that the fields were not exactly orthogonal. A variable capacitor C4 of small value (~0.1–10 pF) was therefore soldered diagonally across the cuts in the center of the top panel as shown in FIG. 2. With correct adjustment and choice of diagonal direction, the isolation could be set to better than 35 dB. With this degree of isolation, the input impedance and tuning of one mode is largely independent of the impedance of the other mode.

The two quadrature channels were tested for quadrature balance, impedance, Q, channel rejection and homogeneity shown in FIG. 7. All tests were done with a network analyzer (HP8752) in free space at 12.85 mhz to allow for frequency shift when placed in the magnet. Results follow in Table 1.

TABLE 1

| | Common | | Helmholtz | | | | | Alderman Grant | | | | |
|---|---|---|---|---|---|---|---|---|---|---|---|---|
| Loading | Crosstalk (-db) | Quadrature Balance (db) | Return Loss (db) | H Level (-dbm) | H Q | A/G Level (-dbm) | Channel Isolation (db) | Return Loss (db) | A/G Level (-dbm) | A/G Q | H Level (-dbm) | Channel Isolation (db) |
| Unloaded | 31 | 1 | 29 | 39 | 190 | 57 | 18 | 39 | 38 | 176 | 61 | 23 |
| 45 kg | 16 | 4 | 37 | 45 | 45 | 60 | 15 | 35 | 41 | 51 | 60 | 19 |
| 68 kg | 14 | 4 | 45 | 47 | 27 | 59 | 12 | 48 | 43 | 27 | 59 | 16 |
| 113 kg | 15 | 4 | 43 | 48 | 24 | 59 | 11 | 35 | 44 | 23 | 60 | 16 |

Cross-talk is the unwanted signal received on one channel compared to a 0 dbm reference being driven into the other one.

Quadrature balance is the difference in level between the channels when each one is driven with the same level.

Helmholtz column—Helmholtz channel driven at coil input, signal received using search coil optimized for best reception of Helmholtz signal. Other channel terminated in 50Ω.

Return loss is the level of reflected power observed on a cable driving the tuned channel. Value is in db below the signal level travelling toward the coil.

H level is the received level on a search coil optimized to receive the Helmholtz channel.

HQ is the quality factor of the desired channel under the specified load.

A/G level is the received level on a search coil optimized to receive the Helmholtz channel. In an ideal situation, there would be no radiation in this direction. So a higher negative db value is desirable.

Channel Isolation is the difference between the signal observed in H level and A/G level. As described in A/G level above, a higher negative db value is desirable.

Alderman Grant definitions can be inferred from those for the Helmholtz column.

Homogenous Volume

Alderman Grant mode: 20 cm×30 cm×20 cm±10% of maximum value

Helmholtz mode: 16 cm×24 cm×20 cm±10% of maximum value

Since various modifications can be made in my invention as herein above described, and many apparently widely different embodiments of same made within the spirit and scope of the claims without departing from such spirit and scope, it is intended that all matter contained in the accompanying specification shall be interpreted as illustrative only and not in a limiting sense.

What is claimed is:

1. A quadrature radio frequency field coil for use in a unidirectional magnetic field for effecting magnetic resonance experiments on a sample comprising:

a first annular conductor lying generally in a first plane at a first end of the coil;

a second annular conductor lying generally in a second plane at a second end of the coil;

the first and second planes being parallel and spaced so as to define a hollow interior of the coil into which the sample can be received;

the first annular conductor including at least one first capacitor connected therein in series;

the second annular conductor including at least one second capacitor connected therein in series;

the first and second annular conductors and the first and second capacitors being arranged such that, in a first mode, current can be caused to flow therein to generate a first oscillating radio frequency field, which is substantially homogeneous within the hollow interior, at a resonant frequency dependent upon the shape and impedance of the first and second annular conductors and the mutual inductance therebetween;

a first plate conductor having a length extending across the annular conductors generally at right angles to the first and second planes so as to bridge the space therebetween;

a second plate conductor having a length extending across the annular conductors generally at right angles to the first and second planes so as to bridge the space therebetween;

the first and second plate conductors being arranged at diametrically opposed locations on the annular conductors and being generally parallel so as to be located on opposite sides of the hollow interior;

the plate conductors being arranged such that, in a second mode, current can be caused to flow in a circuit along the first plate conductor, through the first annular conductor to the second plate conductor, along the second plate conductor and through the second annular conductor to the first plate conductor;

the circuit including at least one third capacitor;

the circuit and the third capacitor being arranged to generate a second oscillating radio frequency field, at a resonant frequency dependent upon the shape and impedance of the first and second plate conductors and the annular rings;

the plate conductors having a width transverse to the length thereof which is sufficient to cause the second field to be substantially homogeneous within the hollow interior;

the first and second annular conductors and the first and second plate conductors being shaped and arranged and the first, second and third capacitors being arranged such that the first and second fields have the same resonant frequency and such that the first and second fields are substantially mutually orthogonal and arranged for co-operation with a main magnetic field perpendicular to the plane of the plate conductors.

2. The coil according to claim 1 wherein the first and second capacitors are arranged relative to the conductors such that the capacitance thereof does not affect the resonant frequency of the second mode and the third capacitor is arranged such that the capacitance thereof does not affect the resonant frequency of mode 1 created by the first and second annular conductors.

3. The coil according to claim 2 wherein the first capacitor is connected in series with the first annular conductor at a longitudinal split in one of the first and second plate conductors, wherein the second capacitor is connected in series with the second annular conductor at a longitudinal split in one of the first and second plate conductors and wherein at least one of the first and second plate conductors is split transversely with the at least one third capacitor connected therein in series.

4. The coil according to claim 2 wherein the first plate conductor is split longitudinally, the first capacitor is connected in series with the first annular conductor at the longitudinal split in the first plate conductor, the second capacitor is connected in series with the second annular conductor at the longitudinal split in the first plate conductor and wherein one of the first and second plate conductors is split transversely with the at least one third capacitor connected therein in series.

5. The coil according to claim 4 wherein the first plate conductor is split both longitudinally and transversely so as to form four separate portions interconnected by said capacitors.

6. The coil according to claim 5 wherein there is provided a tuning capacitor connected diagonally across the transverse and longitudinal splits which is adjustable to tune the fields so as to be more accurately orthogonal.

7. The coil according to claim 1 including a console for creating oscillating signals for supply to the coil for generating said first and second fields and a driving circuit for communicating said signals to the coil wherein the power supply coupling includes a first cable communicating a part of the signal to a split in one of the annular conductors and a second cable communicating a part of the signal to a split in one of the plate conductors.

8. The coil according to claim 7 wherein the power supply coupling includes an adjustable impedance for matching the impedance of the coil to the characteristic impedance of the connected cables and components.

9. The coil according to claim 1 wherein the first, second and third capacitors are adjustable for tuning the resonant frequencies.

10. The coil according to claim 1 wherein the plate conductors have a width transverse to the length thereof which is sufficient to cause the second field to be substantially homogeneous within the hollow interior.

11. The coil according to claim 10 wherein the annular rings are generally circular and the top and bottom plates encompass 80 degrees of the top and bottom of the rings, leaving a 100 degree space on either side.

12. The coil according to claim 1 wherein the first and second annular conductors and the first and second capacitors being arranged such that, in a first mode, current can be caused to flow therein to generate a first oscillating radio frequency field, which is substantially homogeneous within the hollow interior, at a resonant frequency dependent upon the shape and inductance of the first and second annular conductors, the capacitance, and the mutual inductance therebetween.

13. The coil according to claim 12 wherein the annular rings are generally circular and are separated by a distance equal to one radius of the rings.

14. An apparatus for effecting magnetic resonance experiments on a sample comprising:

a magnet having a magnetic field extending in a unidirectional field direction through a space for receiving the sample;

a quadrature radio frequency field coil having:

a first annular conductor lying generally in a first plane at a first end of the coil;

a second annular conductor lying generally in a second plane at a second end of the coil;

the first and second planes being parallel and spaced so as to define a hollow interior of the coil into which the sample can be received;

the first annular conductor including at least one first capacitor connected therein in series;

the second annular conductor including at least one second capacitor connected therein in series;

the first and second annular conductors and the first and second capacitors being arranged such that, in a first mode, current can be caused to flow therein to generate a first oscillating radio frequency field, which is substantially homogeneous within the hollow interior, at a resonant frequency dependent upon the shape and impedance of the first and second annular conductors and the mutual inductance therebetween;

a first plate conductor having a length extending across the annular conductors generally at right angles to the first and second planes so as to bridge the space therebetween;

a second plate conductor having a length extending across the annular conductors generally at right angles to the first and second planes so as to bridge the space therebetween;

the first and second plate conductors being arranged at diametrically opposed locations on the annular conductors and being generally parallel so as to be located on opposite sides of the hollow interior;

the plate conductors being arranged such that, in a second mode, current can be caused to flow in a circuit along the first plate conductor, through the first annular conductor to the second plate conductor, along the second plate conductor and through the second annular conductor to the first plate conductor;

the circuit including at least one third capacitor;

the circuit and the third capacitor being arranged to generate a second oscillating radio frequency field, at a resonant frequency dependent upon the shape and impedance of the first and second plate conductors;

the plate conductors having a width transverse to the length thereof which is sufficient to cause the second field to be substantially homogeneous within the hollow interior;

the first and second annular conductors and the first and second plate conductors being shaped and arranged and the first, second and third capacitors being arranged such that the first and second fields have the same resonant frequency and such that the first and second fields are substantially mutually orthogonal;

the coil being arranged for and mounted within the space arranged such that the magnetic field lies at right angles to the plane of the plate conductors;

a console for creating oscillating signals for supply to the coil for generating said first and second fields;

and a coupling circuit for communicating said signals to the coil.

15. A method for effecting magnetic resonance experiments on a sample comprising:

providing a sample;

providing a magnet having a magnetic field extending in a unidirectional field direction through a space for receiving the sample;

providing a quadrature radio frequency field coil having:

a first annular conductor lying generally in a first plane at a first end of the coil;

a second annular conductor lying generally in a second plane at a second end of the coil;

the first and second planes being parallel and spaced so as to define a hollow interior of the coil into which the sample can be received;

the first annular conductor being shaped and arranged to surround an opening into the hollow interior;

the first annular conductor including at least one first capacitor connected therein in series;

the second annular conductor including at least one second capacitor connected therein in series;

a first plate conductor having a length extending across the annular conductors generally at right angles to the first and second planes so as to bridge the space therebetween;

a second plate conductor having a length extending across the annular conductors generally at right angles to the first and second planes so as to bridge the space therebetween;

the first and second plate conductors being arranged at diametrically opposed locations on the annular conductors and being generally parallel so as to be located on opposite sides of the hollow interior;

mounting the coil within the space arranged such that the magnetic field lies at right angles to the plane of the plate conductors;

inserting the sample into the hollow interior through the opening;

arranging the first and second annular conductors and the first and second capacitors and applying power thereto as an oscillating signal such that, in a first mode, current flows therein to generate a first oscillating radio frequency field, which is substantially homogeneous within the hollow interior, at a resonant frequency dependent upon the shape and impedance of the first and second annular conductors and the mutual inductance therebetween;

arranging the first and second plate conductors and a third capacitor in series therein and applying power thereto as an oscillating signal such that, in a second mode, current flows in a circuit along the first plate conductor, through the first annular conductor to the second plate conductor, along the second plate conductor and through the second annular conductor to the first plate conductor to generate a second oscillating radio frequency field, at a resonant frequency dependent upon the shape and impedance of the first and second plate conductors and the impedance of the third capacitor;

arranging the plate conductors with a width transverse to the length thereof which is sufficient to cause the second field to be substantially homogeneous within the hollow interior;

and arranging the first and second annular conductors and the first and second plate conductors and arranging the first, second and third capacitors such that the first and second fields have the same resonant frequency and such that the first and second fields are substantially mutually orthogonal.

* * * * *